United States Patent

Lien et al.

[11] Patent Number: 5,846,868
[45] Date of Patent: Dec. 8, 1998

[54] METHOD FOR FORMING A WALLED-EMITTER TRANSISTOR

[75] Inventors: Chuen-Der Lien, Mountain View; Kyle Wendell Terrill, Sunnyvale, both of Calif.

[73] Assignee: Integrated Device Technology, Inc., Santa Clara, Calif.

[21] Appl. No.: 456,911

[22] Filed: May 31, 1995

Related U.S. Application Data

[62] Division of Ser. No. 272,277, Jul. 8, 1994, Pat. No. 5,574,305, which is a continuation of Ser. No. 100,620, Jul. 29, 1993, abandoned, which is a division of Ser. No. 835,200, Feb. 13, 1992, Pat. No. 5,258,317.

[51] Int. Cl.[6] .................................................. H01L 21/331
[52] U.S. Cl. .......................... 438/345; 438/309; 438/362; 438/366; 438/439; 148/DIG. 10; 148/DIG. 11; 148/DIG. 124
[58] Field of Search ..................................... 257/558, 592, 257/515; 438/309, 345, 362, 366, 439; 148/DIG. 10, DIG. 11, DIG. 124

[56] References Cited

U.S. PATENT DOCUMENTS

| | | | |
|---|---|---|---|
| 4,441,932 | 4/1984 | Akasaka et al. | 148/1.5 |
| 4,481,706 | 11/1984 | Roche | 29/577 |
| 4,492,008 | 1/1985 | Anantha et al. | 29/571 |
| 4,601,098 | 7/1986 | Oda | 29/578 |
| 4,642,883 | 2/1987 | Sakurai et al. | 29/576 |
| 4,669,179 | 6/1987 | Weinberg et al. | 29/576 |
| 4,675,981 | 6/1987 | Naruke | 29/576 B |
| 4,698,127 | 10/1987 | Hideshima et al. | 156/643 |
| 4,706,378 | 11/1987 | Havemann | 437/24 |
| 4,755,477 | 7/1988 | Chao | 437/36 |
| 4,803,174 | 2/1989 | Hirao | 437/31 |
| 4,962,053 | 10/1990 | Spratt et al. | 437/31 |
| 4,965,220 | 10/1990 | Iwasaki | 437/59 |
| 4,979,010 | 12/1990 | Brighton | 357/34 |
| 5,008,210 | 4/1991 | Chiang et al. | 437/33 |
| 5,258,317 | 11/1993 | Lien et al. | 437/31 |
| 5,289,024 | 2/1994 | Ganschow | 257/592 |

*Primary Examiner*—Peter Toby Brown
*Assistant Examiner*—Long Pham
*Attorney, Agent, or Firm*—Isabelle McAndrews

[57] ABSTRACT

An embodiment of the present invention is a process for semiconductor device having a silicon substrate. The process comprises positioning at least one field implant mask and field implanting a silicon substrate around a bipolar active region in a substrate such that boron atoms are blocked out of an active region, and only the field region surrounding the active area is implanted, the implanting such that a predetermined layout area of a semiconductor device does not need to be increased to compensate for a $BV_{bso}$ problem.

24 Claims, 4 Drawing Sheets

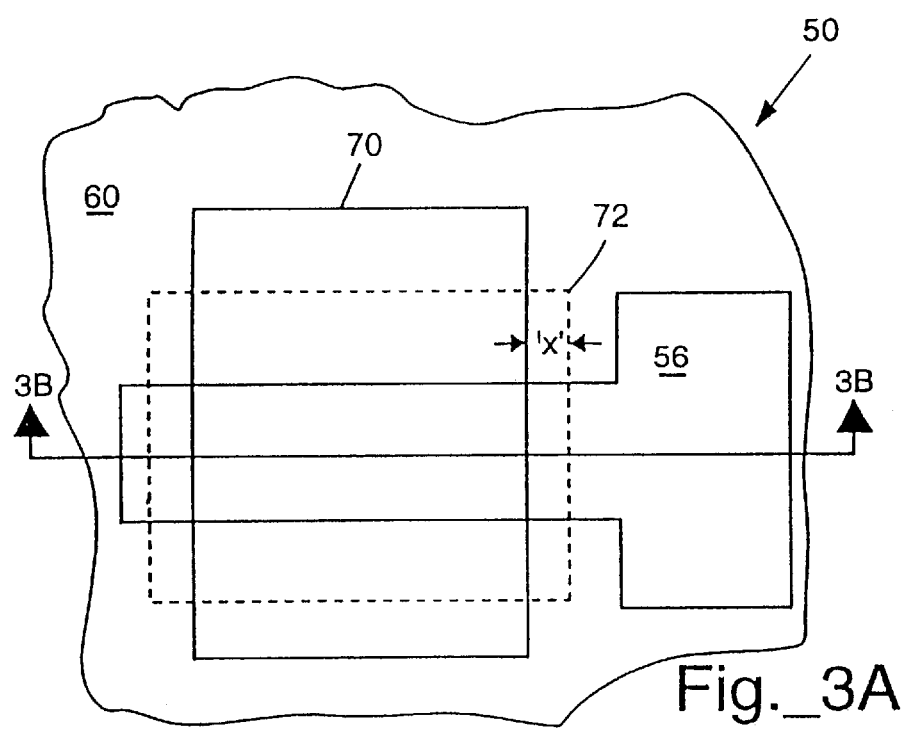
Fig._3A

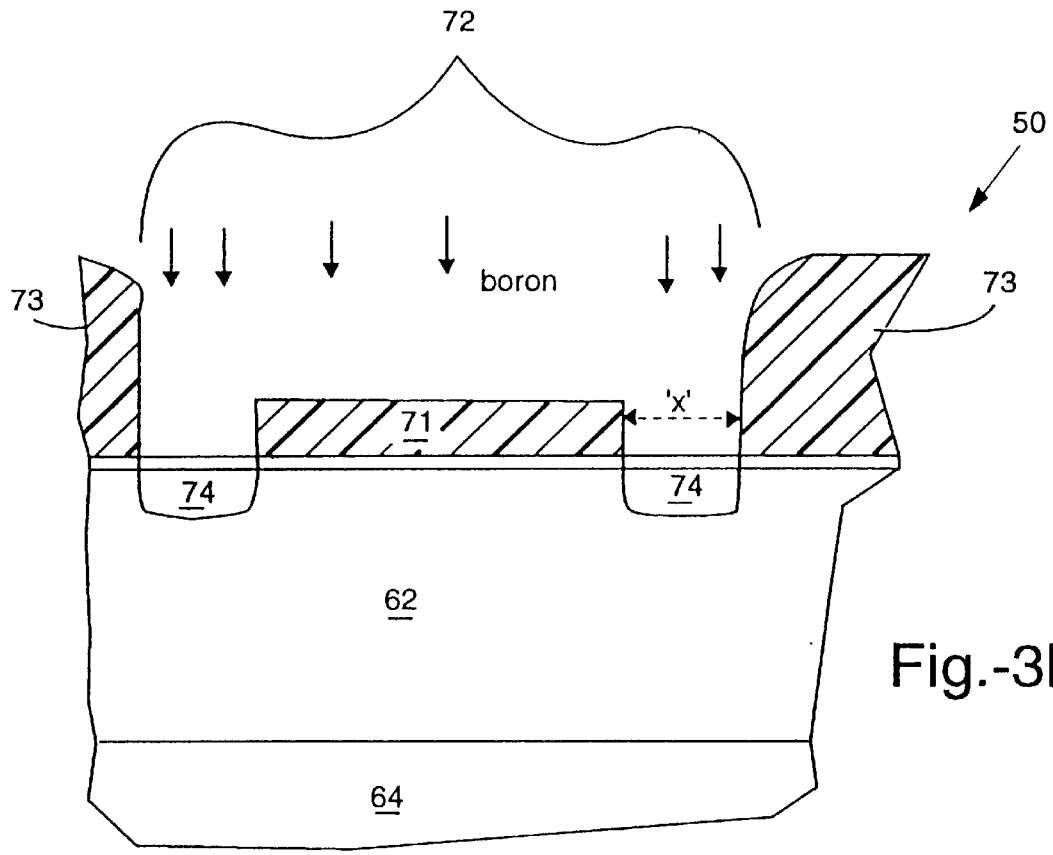
Fig.-3B
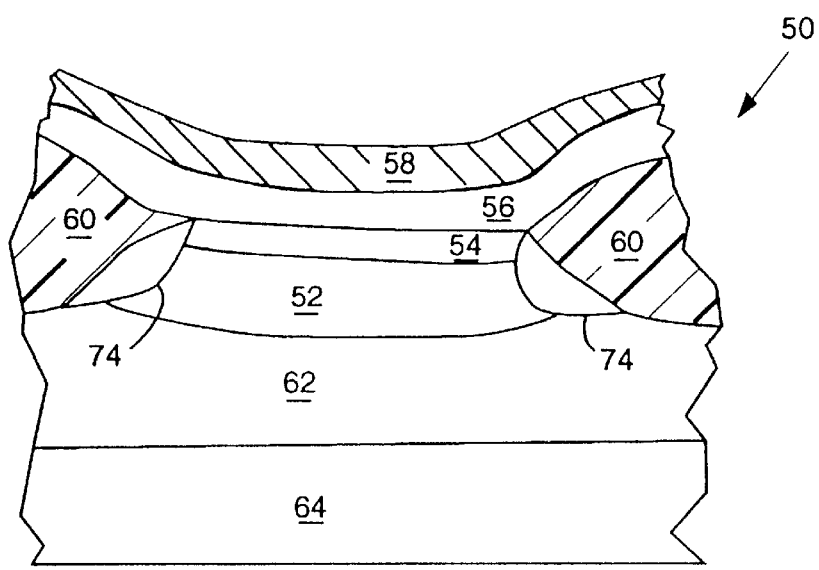
Fig._3C

5,846,868

METHOD FOR FORMING A WALLED-EMITTER TRANSISTOR

RELATED APPLICATIONS

This Application is a divisional of U.S. patent application Ser. No. 08/272,277, filed Jul. 08, 1994, now U.S. Pat. No. 5,574,305, which is a continuation of U.S. patent application Ser. No. 08/100,620, filed Jul. 29, 1993, now abandoned, which was a divisional application of U.S. patent application Ser. No. 07/835,200, filed Feb. 13, 1992, now U.S. Pat. No. 5,258,317.

BACKGROUND OF THE INVENTION

1. Field of the Invention

The invention relates generally to semiconductor processing and more particularly to using field implants in BiCMOS process.

2. Description of the Prior Art

In walled-emitter type transistor structures, for example an NPN transistor 10 in FIGS. 1A and 1B, there is a problem with n-type dopants piling up at the outside edges of a p-type intrinsic base 12. Transistor 10 further comprises an n+ emitter 14, an n+ poly emitter 16, a silicide 18, a surrounding field oxidation 20, an n-type layer 22, and an n+ collector 24. Silicide 18 is not required, and is sometimes omitted in particular prior art devices. A spacer 26 and an extrinsic base 28 are shown only in FIG. 1C so that FIG. 1A is clearer. A so-called "island mask" is used early in the fabrication process of transistor 10 to create a region generally defined by an active area 30.

BiCMOS processes can be used in the prior art to fabricate self-aligned bipolar transistors, such as transistor 10. A masking step is typically employed during fabrication to define the active area 30 which bounds the region of intrinsic base 12. For example, a mask of nitride is temporarily positioned over the active area 30. A field oxide region is formed to surround the active area 30. A second mask defines the patterning of N+ doped polysilicon and silicide films used for poly emitter 16. The advantages of self-aligned transistors are small layout area, small parasitic capacitances, and small base resistance.

There is at least one disadvantage to fabricating bipolar transistors like transistor 10 of FIGS. 1A–1C. The intrinsic base 12 touches the field oxide 20. This constitutes the so-called "walled-emitter" transistor. It is well known that boron atoms in intrinsic base 12 will segregate into the field oxide 20 and arsenic and/or phosphorus in the n-type layer 22 will pile up adjacent to the field oxide 20. The effective base doping in the silicon adjacent to the field oxide 20 is thus lowered, and the degree of decrease cannot be controlled. Therefore, intrinsic base 12 will be more easily depleted by emitter-collector voltages and parasitic currents will result that degrade the performance of transistor 10. Such a reduction in effective base doping causes decreased and unpredictable punch-through voltage characteristics to appear between the collector 24 and emitter 14 (BVces). In high performance applications, the degradation cannot be tolerated. In lower performing, prior art applications, the degradation is not objectionable, and an economic decision can be made to tolerate, rather than fix the problem.

There have been some prior art solutions to the low $BV_{ces}$ problem. For example, the intrinsic base doping can be increased, but this will decrease the current gain (beta) and speed ($f_T$) of a bipolar transistor. This makes such a correction not a good choice, because the usual concern is to increase both to achieve high performance devices.

Some prior art technologies use an additional mask to increase the base doping in the silicon around the field oxide region. Referring to FIG. 2, an NPN walled-emitter transistor 40 is shown in cross section. For ease of illustration, those layers in transistor 40 that are similar to those in transistor 10 have the same element numbers. A pair of $p^+$ skirts 42 and oxide skirts 44 are fabricated after the field oxide is grown. To do this, a second mask, which is not self-aligned, is used as an implant mask. P-type dopants (e.g., boron) are implanted, forming $p^+$ skirts 42. An oxide is then formed on top of that, making oxide skirts 44. The result is the structure of FIG. 2 where the walled-emitter 14 has been insulated at its edges and the base 12 has been enhanced by the more highly doped $p^+$ skirts 42. The disadvantage of this approach is, of course, one more masking step, a few more processing steps, and more layout area are needed to achieve equivalent bipolar current drive levels.

SUMMARY OF THE PRESENT INVENTION

It is therefore an object of the present invention to provide a method of producing transistors with predictable punch-through voltage characteristics (BVces).

Briefly, an embodiment of the present invention is a process for semiconductor device having a silicon substrate. The process comprises positioning at least one field implant mask and field implanting a silicon substrate around a bipolar active region in a substrate such that boron atoms are blocked out of an active region, and only the field region surrounding said active area is implanted, said implanting such that a predetermined layout area of a semiconductor device does not need to have doping increased to compensate for a $BV_{bso}$ problem.

An advantage of the present invention is that it provides a process in which transistors with predictable punch-through voltage characteristics (BVces) are produced.

A further advantage of the present invention is that it provides a process which embodies a self-aligned process.

A further advantage of the present invention is that it provides a process in which the low $BV_{ces}$ problem in walled-emitter bipolars using BiCMOS technology is resolved.

A further advantage of the present invention is that it provides a process with which walled-emitter transistors with large active areas can be formed.

A further advantage of the present invention is that it provides a process in which a walled-emitter transistor can be formed that does not need an additional masking step for field implants.

These and other objects and advantages of the present invention will no doubt become obvious to those of ordinary skill in the art after having read the following detailed description of the preferred embodiments which are illustrated in the various drawing figures.

IN THE DRAWINGS

FIG. 3A is a top view of an NPN bipolar transistor, made according to an embodiment of the present invention, which uses a field implant mask to put boron in the field region before field oxidation. During field implant a poly emitter is not yet present;

FIG. 3B is a cross section of the device of FIG. 3A taken along the line 3B—3B; and FIG. 3C is a cross section of the device of FIG. 3A taken along the line 3B—3B at a later stage of processing than shown in FIG. 3B.

DETAILED DESCRIPTION OF THE PREFERRED EMBODIMENTS

Figure 1A:
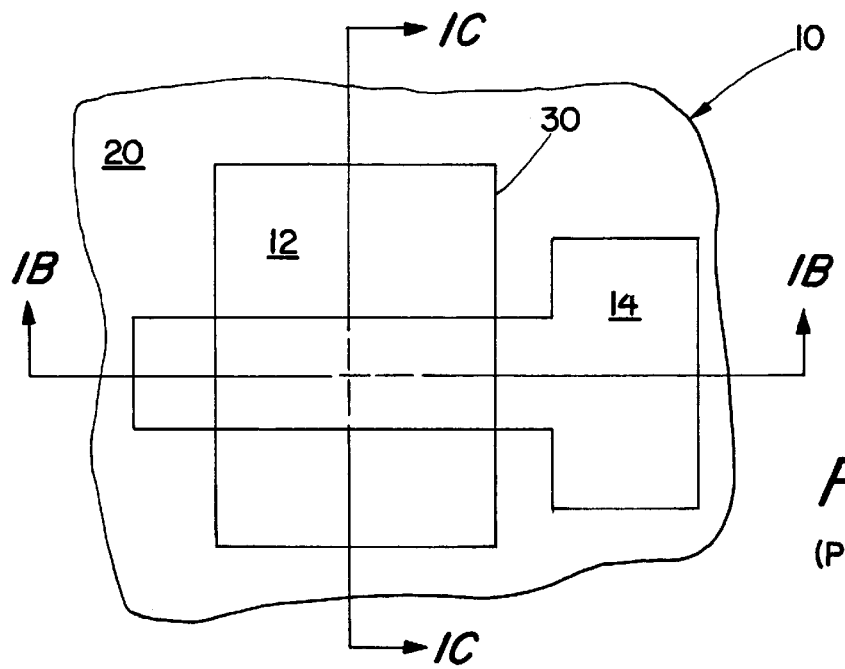
FIG. 1A is a top view of a prior art NPN "walled emitter" bipolar transistor with a poly emitter, a defined active region for a base and collector, and a field oxide all around outside the active region.
Figure 1B:
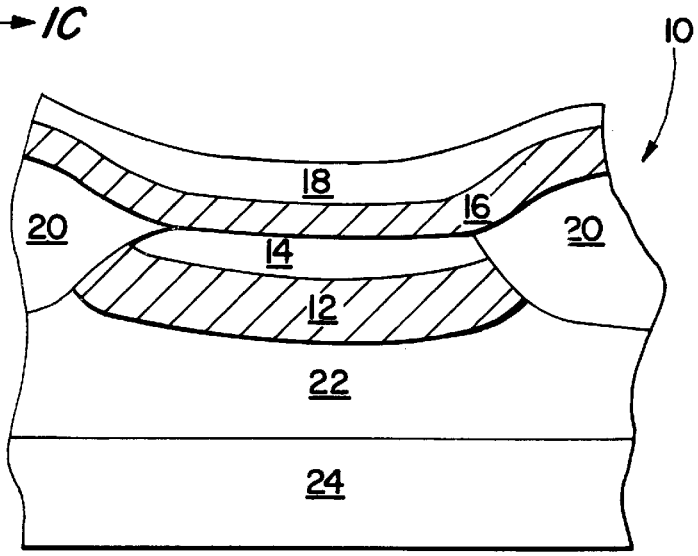
FIG. 1B is a cross sectional view of the bipolar transistor of FIG. 1A taken along the line 1B—1B.
Figure 1C:
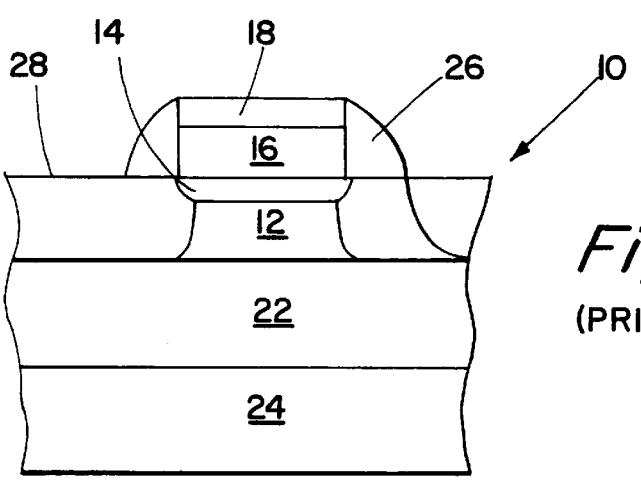
FIG. 1C is a cross sectional view of the bipolar transistor of FIG. 1A taken along the line 1C–1C.
Figure 2:
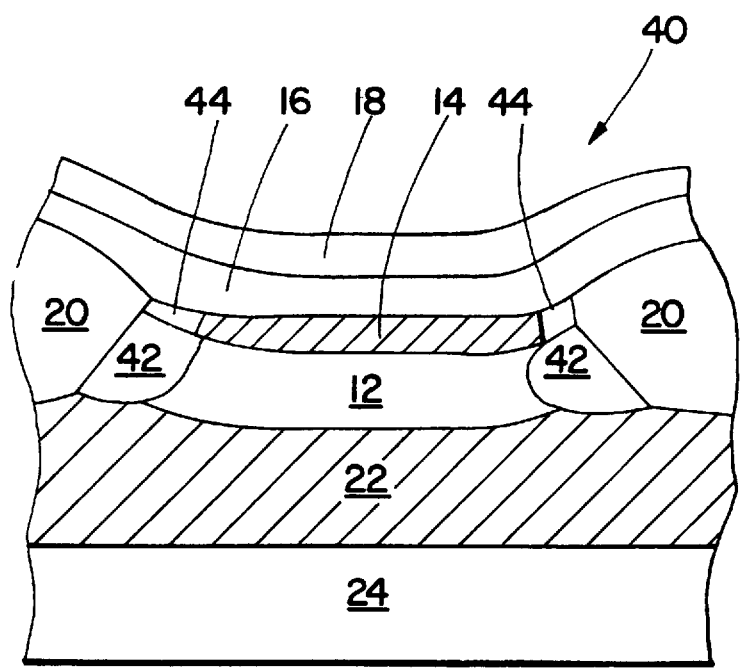
FIG. 2 is another prior art equivalent to FIG. 1B when a masking step is added after field oxide to increase the base doping around the field oxide.

In FIGS. 3A, 3B, and 3C, a walled-emitter NPN transistor 50, according to an embodiment of the present invention, comprises a p-type intrinsic base 52, an n+ emitter 54, an n+ poly layer 56, a silicide layer 58, a surrounding field oxide 60, an n-type layer 62, and an n+ collector 64. A spacer 66 and an extrinsic base 68 are not shown so that FIG. 3A can be drawn uncluttered. An active area 70 outlines the active area of transistor 50 and is created in part by depositing a nitride island mask 71.

Transistor 50 is fabricated in a BiCMOS process in which an opening 72 in a photoresist mask 73 (FIG. 3B) is used to first implant boron to form a plurality of p-wells 74 in the region of field oxide 60 before a conventional field oxidation process step. Opening 72 in photoresist mask 73 therefore performs a second, additional duty beyond that common in conventional processes. The p-wells 74 will naturally be self-aligned to the active area of transistor 50 because nitride film blocks the implant. The placement of p-wells 74 solves the problem of boron segregating and moving into the field oxide 60 from base 52. As a result, intrinsic base 52 can be optimally doped (e.g., active area 70) to achieve high transistor beta and $f_T$. The function of preventing punch through in the area of intrinsic base 52 that is adjacent to field oxide 60 is embodied in p-wells 74.

The field implant mask, photoresist mask 73, is thereby used to put a field implant into the silicon substrate surrounding the bipolar active region. Ions of boron atoms during the implanting are blocked out of the active region by the nitride island mask 71. Implants 74 will only occur in the field region outside active area 70 and inside opening 72. Such a region "x" (FIGS. 3A and 3B), lying between the borders of active area 70 and the field implant mask opening 72, is preferably approximately one micrometer wide. A disadvantage is the punch-through voltage between base 52 and substrate, e.g. 64, $BV_{bso}$, can be adversely affected. However, in many BiCMOS technologies, $BV_{bso}$ is much higher than its minimum required value. Therefore, enough margin pre-exists, that such a reduction may not provoke an increase in the layout area to compensate for the lowering of $BV_{bso}$.

The process for forming a walled-emitter transistor comprising the steps of applying a first mask to a substrate that includes an opening in a photoresist for defining an implant to surround a bipolar active region in the substrate. Then, a second mask is deposited on said substrate within said opening for defining the active region. Thereafter, a dopant is ion implanted into the substrate to form well regions.

The process to fabricate transistor 50 is advanced from the step shown in FIG. 3B to the step shown in FIG. 3C as follows:

photoresist 73 is stripped off;
nitride mask 71 is used to form field oxide 60 in the area surrounding what will be intrinsic base 52 (the area outside area 70 in FIG. 3A);

nitride mask 71 in opening 72 is removed;
p-type base 52 is implanted;
polysilicon is deposited and doped to form emitter 54 and n+ poly layer 56; and
silicide layer 58 is deposited.

Compared to conventional processes, the traditional field implant mask can be eliminated if a low dose boron implant is used early in the fabrication. The low dose boron is blanket implanted before the customary field oxidation step. Because it is a blanket implantation, it can be expected to penetrate the n-well field region. As such, the dose should be low enough to guarantee that the n-well retains a high field threshold voltage. A low dose (e.g., 6E12) boron implant is preferred, because this avoids significantly upsetting the n-well field threshold, and yet will still yield desirable increased levels of $BV_{ces}$.

Additional masking and other processing steps are not required and the layout area does not need to be increased in the implementation. In other technologies where the present process will require an additional implantation step, an additional masking step can nevertheless be avoided and no more layout area is required.

Although the present invention has been described in terms of the presently preferred embodiments, it is to be understood that the disclosure is not to be interpreted as limiting. Various alterations and modifications will no doubt become apparent to those skilled in the art after having read the above disclosure. For example, even though NPN transistors have been described, the present invention is just as applicable to PNP type transistors. Accordingly, it is intended that the appended claims be interpreted as covering all alterations and modifications as fall within the true spirit and scope of the invention.

What is claimed is:

1. A method of semiconductor fabrication of a bipolar transistor, the method comprising:

forming wells in a substrate, using a first and second mask, said first mask being patterned separately from said second mask, and said wells being contiguous with an active region of said bipolar transistor;

forming isolation regions to surround said bipolar active region;

forming a base in contact with said bipolar active region that is physically separated from said isolation regions by said wells; and forming an emitter above said base.

2. The method of claim 1, wherein said wells are interposed between said isolation regions and said base.

3. The method of claim 1, further comprising depositing in said substrate a layer having a different conductivity than said wells.

4. The method of claim 3, wherein said layer comprises polysilicon.

5. The method of claim 4 further comprising depositing a silicide layer on said polysilicon layer.

6. The method of claim 4, wherein said emitter is formed by deposition of said polysilicon layer.

7. The method of claim 1, further comprising depositing in said substrate a layer having a different conductivity than said wells.

8. The method of claim 7, wherein said dopant is implanted using a nitride layer as one of said first and second masks.

9. The method of claim 7, wherein said layer comprises polysilicon.

10. The method of claim 9, further comprising depositing a silicide layer on said polysilicon layer.

11. The method of claim 1, wherein said base is self-aligned with said well.

12. A method of forming a bipolar transistor in a substrate containing a collector region comprising:
   1) selectively implanting a dopant using a first and a second mask to form a well region, wherein no portion of said first mask is patterned when said second mask is patterned;
   2) forming an isolation region using one of said masks;
   3) forming a base in said substrate above said collector region; and
   4) forming an emitter in a location above said base.

13. The method of claim 12, wherein said wells comprise an extrinsic base region.

14. The method of claim 12, wherein said wells are formed by implanting a dopant at a low dosage.

15. The method of claim 14, wherein said dopant is implanted using a nitride layer as a mask.

16. The method of claim 15, wherein said nitride layer is used to mask said substrate during formation of said isolation regions.

17. The method of claim 1, wherein said first and said second mask are composed of dissimilar material.

18. The method of claim 12, wherein one of said first and second masks is composed of dissimilar material than the other mask.

19. A method of semiconductor fabrication of a bipolar transistor, the method comprising:
   forming wells in a substrate, using a first and second mask, said wells being contiguous with an active region of said bipolar transistor;
   forming isolation regions using said second mask, wherein said second mask is not composed of a portion of said first mask;
   forming a base in contact with said bipolar active region; and
   forming an emitter above said base.

20. The method of claim 19, wherein said wells are interposed between said isolation regions and said bipolar active region.

21. The method of claim 12, wherein said well region is interposed between said isolation region and said base.

22. The method of claim 1, wherein said first mask is removed prior to forming said isolation regions with said second mask.

23. The method of claim 19, wherein one of said first and second masks is of dissimilar material than the other.

24. The method of claim 19, wherein said base is physically separated from said isolation regions by said wells.

* * * * *